United States Patent [19]

Suzuki et al.

[11] Patent Number: 4,513,062
[45] Date of Patent: Apr. 23, 1985

[54] CERAMIC BODY HAVING A METALLIZED LAYER

[75] Inventors: Go Suzuki, Nagoya; Kazuo Michishita, Fujiyoshida, both of Japan

[73] Assignee: NGK Insulators, Ltd., Nagoya, Japan

[21] Appl. No.: 589,540

[22] Filed: Mar. 14, 1984

Related U.S. Application Data

[63] Continuation of Ser. No. 261,792, May 8, 1981, abandoned, which is a continuation of Ser. No. 48,455, Jun. 14, 1979, abandoned.

[51] Int. Cl.$^3$ .............................. B22F 7/04; B22F 7/08
[52] U.S. Cl. .................................. 428/565; 174/120 C; 428/433; 428/620; 428/627; 428/665; 428/901
[58] Field of Search ..................... 174/120 C; 428/433, 428/565, 620, 627, 665, 901

[56] References Cited

U.S. PATENT DOCUMENTS

| 3,150,971 | 9/1964 | Weisert et al. | 420/430 |
| 3,833,842 | 9/1974 | Cunningham et al. | 420/430 |
| 4,168,342 | 9/1979 | Arai et al. | 428/426 |
| 4,168,343 | 9/1979 | Arai et al. | 428/426 |
| 4,219,448 | 8/1980 | Ross | 427/88 |
| 4,475,029 | 10/1984 | Yoshida et al. | 219/553 X |

Primary Examiner—Leland A. Sebastian
Attorney, Agent, or Firm—Bert J. Lewen; Norbert P. Holler

[57] ABSTRACT

A ceramic body having a metallized layer which comprises a ceramic substrate and a metallized layer fired on the substrate to be integrated or further comprises a conductive layer consisting of a noble metal or noble metal alloy to be joined onto the metallized layer, the composition of the metallized layer being one or more of a silicide of transition metals belonging to Groups V and VI of periodic table; one or more of a boride of lanthanum and a boride of transition metals belonging to Groups IV, V and VI of periodic table; or a high melting point metal or alloy unmelted at a firing temperature of the ceramic substrate and containing, based on 100 parts by weight of the metal or alloy, 0.5-25 parts by weight of niobium, 0.5-10 parts by weight of yttrium, 0.5-10 parts by weight of tantalum, 0.5-25 parts by weight of mixture of niobium and yttrium, 0.5-25 parts by weight of mixture of yttrium and tantalum, 0.5-25 parts by weight of mixture of niobium and tantalum, 0.5-25 parts by weight of mixture of niobium, yttrium and tantalum, 0.05-3 parts by weight of nickel, 0.5-4 parts by weight of chromium or 0.05-3 parts by weight of mixture of nickel and chromium, which is a useful material for various electronic and electric apparatuses.

2 Claims, 5 Drawing Figures

CERAMIC BODY HAVING A METALLIZED LAYER

This is a continuation of application Ser. No. 261,792, filed May 8, 1981, now abandoned, which, in turn, is a continuation of application Ser. No. 048,455, filed June 14, 1979 now abandoned.

This invention relates to a ceramic body having an electrically conductive metallized layer which is useful as a material for thick film circuit substrate for hybrid integrated circuits, ceramic heater and many other electronic and electric apparatuses.

On ceramic bodies used as a material for electronic and electric apparatuses, an electrically conductive layer is usually formed by joining a conductive layer (13) consisting of a noble metal or a noble metal alloy such as gold, silver, silver-palladium alloy or the like to a fired ceramic plate (11), as shown in the thick film circuit substrate of accompanying FIG. 4. However, this type of products has a fault that it needs a large quantity of noble metal and therefore is expensive. In order to overcome this fault, there has been disclosed a product which is so constructed that, as shown in the accompanying FIG. 5 illustrating the case of thick film circuit substrate, a metallized layer (12) consisting of a high melting point metal such as tungsten, molybdenum or the like, less expensive than the noble metals, is provided on a fired ceramic plate (11), the contact part of said metallized layer (12) is coated with an insulating layer (15) made of, for example, a ceramic layer having through-holes (18), said through-holes (18) are filled with gold, silver, silver-palladium alloy or the like constituting an oxidation-proofing noble metal part (17) so that the surface of the metallized layer (12) consisting of readily oxidizable high melting point metal such as tungsten, molybdenum or the like becomes entirely free from exposure, said oxidation-proofing noble metal part (17) is joined onto a conductive layer (13) consisting of a noble metal or a noble metal alloy such as gold, silver, silver-palladium alloy or the like so that the metallized layer (12) consisting of a high melting point metal such as tungsten, molybdenum or the like is completely covered with said noble metal part (17) and the insulating layer (15), and thereby the metallized layer (12) can be protected against oxidation even in the oxidative atmosphere used for firing the conductive layer (13) consisting of a noble metal or a noble metal alloy and the resistor (14). This type of product is advantageous over the product of FIG. 4 in that the amount of expensive noble metal or noble metal alloy such as gold, silver, silver-palladium alloy or the like is lessened by replacing it by a less expensive high melting point metal such as tungsten, molybdenum or the like. However, it still has a problem in respect of mass productivity because the above-mentionned complicated coating procedures have to be employed for the sake of protection against oxidation even in the oxidative atmosphere occurring at the time of firing the conductive layer (13) consisting of a noble metal or a noble metal alloy and the resistor (14). Moreover, pin holes are often formed in the oxidation-proofing noble metal part (17), owing to which the metallized layer (12) is frequently oxidized in the process of oxidative firing of the conductive layer (13) consisting of a noble metal or a noble metal alloy and the resistor (14) and, as a result, there are yielded defective articles having the function of thick film circuit substrate stop. In view of above, it has been earnestly desired to develop a ceramic body having a metallized layer which can be mass produced less expensively and having the metallized layer excellent both in electric conductivity and adhesive strength to the ceramic substrate.

This invention relates to a ceramic body having a metallized layer which has been accomplished with the aim of satisfying the above-mentioned desire. Hereunder, embodiments of this invention will be illustrated with reference to the case of thick film circuit substrate shown in the accompanying FIGS. 1, 2 and 3.

Figure 1:
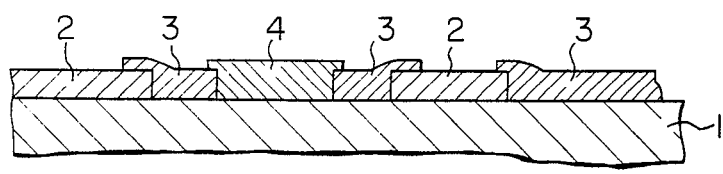
FIG. 1 is a partially cutaway sectional view of the thick film circuit substrate illustrating an embodiment of this invention.

In FIG. 1, (1) is a ceramic substrate. On the upper surface of the substrate (1), there is formed a fired and integrated metallized layer (2) at the appointed position. Said metallized layer (2) is joined onto a conductive layer (3) consisting of a noble metal or a noble metal alloy. The composition of said metallized layer (2) is one or more of a silicide of transition metals belonging to Groups V and VI of periodic table; one or more of a boride of lanthanum and a boride of transition metals belonging to Groups IV, V and VI of periodic table; or a high melting point metal or alloy unmelted at a firing temperature of the ceramic substrate (1) and containing, based on 100 parts by weight of the metal or alloy, 0.5-25 parts by weight of niobium, 0.5-10 parts by weight of yttrium, 0.5-10 parts by weight of tantalum, 0.5-25 parts by weight of mixture of niobium and yttrium, 0.5-25 parts by weight of mixture of yttrium and tantalum, 0.5-25 parts by weight of mixture of niobium and tantalum, 0.5-25 parts by weight of mixture of niobium, yttrium and tantalum, 0.05-3 parts by weight of nickel, 0.5-4 parts by weight of chromium or 0.05-3 parts by weight of mixture of nickel and chromium. On said conductive layer (3) consisting of a noble metal or a noble metal alloy is provided a resistor (4).

Figure 2:
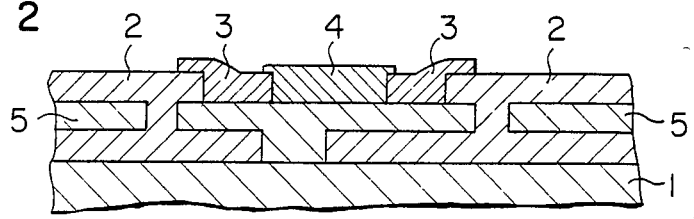
FIG. 2 and FIG. 3 are partially cutaway sectional views of the thick film circuit substrate illustrating other embodiments of this invention.

In case where the metallized layer (2) is formed into a special multi-layer construction as shown in the embodiment of FIG. 2, an insulating layer (5) consisting of ceramics or the like is inserted between the layers constituting the metallized layer (2) and integrated therewith.

Figure 3:
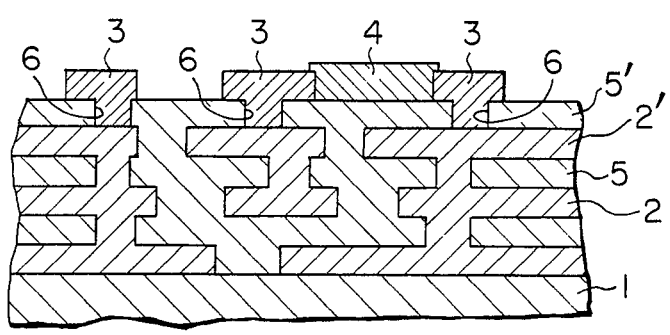
Figure 4:
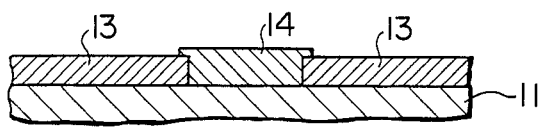
FIGS. 4 and 5 are partially cutaway sectional views of conventional thick film circuit substrate.
Figure 5:
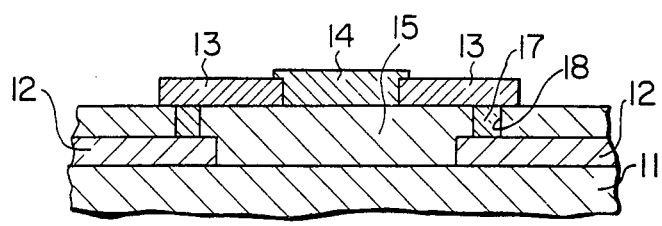

Further, in the embodiment shown in FIG. 3, the multi-layers are formed from metallized layer (2) and insulating layers (5) consisting of ceramics or the like, and the uppermost layer (5') of insulating layer (5) having through-holes or slits (6) is provided on the uppermost layer (2') of metallized layer (2) so that the uppermost layer (2') of metallized layer (2) and the conductive layer (3) consisting of a noble metal or a noble metal alloy come in mutual contact or continuity. In this case, the metallized layer (2) is completely enclosed by the insulating layer (5) and the conductive layer (3) so as to improve the reliability of the metallized layer (2) against the atmospheric conditions such as moisture. It is possible to utilize the existing insulating layer (5) as it is, and also to form condensers by replacing the insulating layer partially or wholly by an dielectric layer.

The product thus constructed is put to use after being attached to semi-conductors, condensers, lead wires and the like by means of Pb-Sn or Au-Si solder, electrically conductive synthetic resin or the like, in the same manner as in the usual thick film circuit substrates. In this type of product, the major part of the conductive layer, essentially necessary for constituting a thick film circuit substrate, is made of a metallized layer (2) fired onto the upper surface of a fired ceramic substrate (1), and a conductive layer (3) consisting of expensive noble metal or noble metal alloy is used only in the limited necessary parts, and therefor, the product of this invention can be offered far less expensively than conventional products. In addition, the metallized layer (2) is composed of one or more of a silicide of transition metals belonging to Groups V and VI of periodic table; one or more of a boride of lanthanum and a boride of transition metals belonging to Groups IV, V and VI of periodic table; or a high melting point metal or alloy unmelted at the firing temperature of the ceramic substrate (1) and containing, based on 100 parts by weight of the metal or alloy, 0.5–25 parts by weight of niobium, 0.5–10 parts by weight of yttrium, 0.5–10 parts by weight of tantalum, 0.5–25 parts by weight of mixture of niobium and yttrium, 0.5–25 parts by weight of mixture of yttrium and tantalum, 0.5–25 parts by weight of mixture of niobium and tantalum, 0.5–25 parts by weight of mixture of niobium, yttrium and tantalum, 0.05–3 parts by weight of nickel, 0.5–4 parts by weight of chromium or 0.5–3 parts by weight of mixture of nickel and chromium, owing to which the metallized layer (2) is excellent in conductivity in any case and also has a very good compatibility with the ceramic substrate (1) enough to give a high adhesive strength. Furthermore, when a ceramic body having the metallized layer (2) is fired at the time of manufacture for the purpose of joining it to conductive layer (3) or a resistor, the metallized layer (2) keeps resistant to oxidation and its appropriate conductive function is not injured in any of the above-mentioned cases. Further, among the various types of metallized layers (2) mentioned above, that composed of a high melting point metal or alloy unmelted at the firing temperature of the ceramic substrate such as molybdenum, tungsten, tungsten carbide or the like and containing, based on 100 parts by weight of the metal or alloy, the specified quantities of niobium, yttrium, tantalum, niobium-yttrium mixture, yttrium-tantalum mixture, niobium-tantalum mixture, niobium-yttrium-tantalum mixture, nickel, chromium or nickel-chromium mixture is limited in composition as expressed by the aforementioned numerical figures. This is for the reason that, if the quantity of the additive elements is smaller than the lower limit, the high melting point metal or alloy constituting the main component of metallized layer is oxidized when the conductive layer consisting of a noble metal or a noble metal alloy and the resistor are fired in an oxidative atmosphere in the manufacture of a thick film circuit substrate as a ceramic body having a metallized layer and thereby the metallized layer loses conductivity and its function is damaged and that, if the quantity of the additive element exceeds the higher limit, the adhesion between the ceramic substrate (1) and the metallized layer (2) becomes poor so that the metallized layer (2) peels off from the ceramic substrate (1) and its function is lost when an external force is applied before or after setting the thick film circuit substrate into an electronic apparatus or in the course of using the apparatus. Only when the composition of metallized layer (2) is in conformity with the above-mentioned values, the metallized layer (2) can maintain its electric conductivity without undergoing oxidation in the process of manufacture and do not peel off from the ceramic substrate (1) and can perform an exact function as a thick film circuit substrate after being joined to a conductive layer (3) consisting of a noble metal or a noble metal alloy and further to resistors, lead wires, semi-conductors, condensers, filters and the like.

In producing the above-mentioned thick film circuit substrate as an example of ceramic body having such metallized layer, a raw powder such as alumina, beryllia, forsterite or the like is mixed first with fluxes and then with an organic binder such as polyvinyl butyral and an organic solvent such as toluene, butanol or the like. After the mixture is kneaded and defoamed under vacuum, it is formed into a ceramic green sheet by tape casting method, extrusion, etc. The ceramic green sheet is punched out to be an appropriate dimension and shape, subjected to an appropriate through hole-punching process, and then subjected to an appropriate through hole-printing process with a paste which comprises materials for realizing the aforementioned composition of metallized layer and conventional additives. Said conventional additives consist of fluxes such as glass, ceramics or the like; a sintering agent such as titanium, manganese or the like; a binder such as ethyl cellulose or the like; and a solvent such as butyl carbitol or the like. Thus, there is obtained a ceramic green sheet having an electric continuity from upper side to lower side. One surface or both surfaces of the green sheet itself or a ceramic substrate obtainable by firing the green sheet is alternately printed with the above-mentioned paste and an insulating layer consisting of a high melting point ceramics or glass such as alumina, beryllia, magnesia-alumina-silica type glass or the like to form multi-layers. In this case, the intermediate metallized layers are so formed that they are electrically connected mutually at the position of through-holes. Then, the above-mentioned metallized-layer-forming paste is printed onto the uppermost part to form a printed layer and it is fired at 1,450° C. to 1,600° C. in a reducing atmosphere to give a basic circuit substrate. Of course, it is also allowable to print only the metallized layer-forming paste, without combination with insulating layer, onto the ceramic green sheet or a ceramic substrate obtained by firing the green sheet and then to fire the printed sheet or substrate. It is also allowable to form a printed condenser by utilizing the above-mentioned paste as the upper and lower electrodes. Then, the terminals through which resistors, condensers, semiconductors, lead wires and the like are to be attached to the basic circuit substrate in the subsequent step are printed with a conductive paste comprising a noble metal or a noble metal alloy such as gold, silver, silver-palladium alloy or the like and fired at 500° C. to 900° C. in an oxidative atmosphere. Then it is printed with a thick film resistor paste and again fired at 500° C. to 900° C. in an oxidative atmosphere. Finally, semi-conductors, condensers, lead wires and the like are attached by means of Pb-Sn or Au-Si solder, an electrically conductive synthetic resin or the like. Although the description given above deals only with a thick film circuit substrate as one embodiment of this invention, it is needless to say that this invention can be applied to all the ceramic bodies used as a material for various electronic and electric apparatuses in which a metallized layer, as a conductive layer, is fired and integrated with a ceramic substrate, such as ceramic packages, ceramic heater and the like.

Next, a linear printed layer having a width of 5 mm and a length of 50 mm, as a metallized pattern, is formed on the whole span of a substrate from its one end to the other end, the printed layer is fired in an atmosphere of decomposed ammonia gas at 1,550° C. to convert it into an integrated metallized layer. A silver-palladium conductive paste is printed on the both lateral faces of the substrate so that the paste joins onto the both ends of the metallized layer, and it is fired at 760° C. in an oxidative atmosphere to give a silver-palladium conductive part. Resistance of the product thus obtained is shown in the following table, wherein Samples 1–33 are ceramic bodies having a metallized layer of this invention while Comparative Samples 1'–5' are ceramic bodies of which metallized layer consists only of a high melting point metal or a high melting point alloy unmelted at the firing temperature of the ceramic substrate.

| Sample | Composition of conductive material in metallized layer (parts by weight) | | Resistance (Ω) (Evaluation) |
|---|---|---|---|
| 1 | Vanadium silicide | 100 | Under 0.2 Ω (Acceptable) |
| 2 | Niobium silicide | 100 | Under 0.2 Ω (Acceptable) |
| 3 | Tantalum silicide | 100 | Under 0.2 Ω (Acceptable) |
| 4 | Chromium silicide | 100 | Under 0.2 Ω (Acceptable) |
| 5 | Molybdenum silicide | 100 | Under 0.2 Ω (Acceptable) |
| 6 | Tungsten silicide | 100 | Under 0.2 Ω (Acceptable) |
| 7 | Titanium boride | 100 | Under 0.2 Ω (Acceptable) |
| 8 | Zirconium boride | 100 | Under 0.2 Ω (Acceptable) |
| 9 | Hafnium boride | 100 | Under 0.2 Ω (Acceptable) |
| 10 | Vanadium boride | 100 | Under 0.2 Ω (Acceptable) |
| 11 | Niobium boride | 100 | Under 0.2 Ω (Acceptable) |
| 12 | Tantalum boride | 100 | Under 0.2 Ω (Acceptable) |
| 13 | Chromium boride | 100 | Under 0.2 Ω (Acceptable) |
| 14 | Molybdenum boride | 100 | Under 0.2 Ω (Acceptable) |
| 15 | Tungsten boride | 100 | Under 0.2 Ω (Acceptable) |
| 16 | Lanthanum boride | 100 | Under 0.2 Ω (Acceptable) |
| 17 | Molybdenum silicide + Tantalum silicide | 70 30 | Under 0.2 Ω (Acceptable) |
| 18 | Titanium boride + Niobium boride | 50 50 | Under 0.2 Ω (Acceptable) |
| 19 | Chromium silicide + Zirconium boride + Lanthanum boride | 30 30 40 | Under 0.2 Ω (Acceptable) |
| 20 | Molybdenum + Niobium | 100 2 | Under 0.2 Ω (Acceptable) |
| 21 | Tungsten + Yttrium | 100 5 | Under 0.2 Ω (Acceptable) |
| 22 | Tungsten carbide + Tantalum | 100 5 | Under 0.2 Ω (Acceptable) |
| 23 | Tungsten + Niobium + Yttrium | 100 1 1 | Under 0.2 Ω (Acceptable) |
| 24 | Molybdenum + Yttrium + Tantalum | 100 5 4 | Under 0.2 Ω (Acceptable) |
| 25 | Tungsten carbide + Niobium + Tantalum | 100 1 10 | Under 0.2 Ω (Acceptable) |
| 26 | Tungsten + Niobium + Yttrium + Tantalum | 100 4 1 2 | Under 0.2 Ω (Acceptable) |
| 27 | Tungsten + Nickel | 100 1 | Under 0.2 Ω (Acceptable) |
| 28 | Molybdenum + Chromium | 100 2 | Under 0.2 Ω (Acceptable) |
| 29 | Tungsten carbide + Nickel + Chromium | 100 1 0.5 | Under 0.2 Ω (Acceptable) |
| 30 | Tungsten + Niobium + Nickel | 100 5 1 | Under 0.2 Ω (Acceptable) |
| 31 | Molybdenum + Yttrium + Tantalum + Chromium | 100 2 2 1 | Under 0.2 Ω (Acceptable) |
| 32 | Molybdenum silicide + Tungsten + Nickel | 30 70 0.7 | Under 0.2 Ω (Acceptable) |
| 33 | Titanium boride + Molybdenum + Niobium | 50 50 10 | Under 0.2 Ω (Acceptable) |

| Comparative sample | Composition of conductive material in metallized layer (parts by weight) | | Resistance (Ω) (Evaluation) |
|---|---|---|---|
| 1' | Molybdenum | 100 | Infinite because of being oxidized (Rejected) |
| 2' | Tungsten | 100 | Infinite because of being oxidized (Rejected) |
| 3' | Tungsten carbide | 100 | Infinite because of being oxidized (Rejected) |
| 4' | Molybdenum + Tungsten | 50 50 | Infinite because of being oxidized (Rejected) |
| 5' | Molybdenum + Tungsten + Tungsten carbide | 30 40 30 | Infinite because of being oxidized (Rejected) |

As is clear from the explanation described above, this invention provides a product in which the metallized layer is formed into a sintered body having the aforementioned composition. Owing to this, the conductivity of metallized layer is not injured even when the metallized layer is exposed to an oxidative atmosphere and, furthermore, the adhesive strength to the ceramic substrate is excellent. Since the conductive layer consisting of expensive noble metal or noble metal alloy is wholly or partially replaced with said metallized layer, the ceramic body of this invention can be provided inexpensively. As above, the ceramic body of this invention can sweep away all the disadvantages of the hitherto known ceramic bodies of this type, and it brings about a great advantage in the industry.

What is claimed is:

1. A ceramic body having a printed-metallized layer which comprises a ceramic substrate of insulating material and at least one printed-metallized layer co-fired on the substrate to be integrated, the composition of the printed-metallized layer comprising 100 parts by weight of one or more of tungsten, molybdenum and tungsten carbide and one metal or metal mixture selected from the following groups (amounts being based on the total amount of tungsten, molybdenum and/or tungsten carbide):

0.5 to 25 parts by weight niobium,
    0.5 to 10 parts by weight yttrium,
    0.5 to 25 parts by weight niobium plus yttrium,
    0.05 to 3 parts by weight nickel.

2. A ceramic body as claimed in claim 1, wherein a conductive layer consisting essentially of a noble metal or a noble metal alloy is further joined onto the printed-metallized layer.

* * * * *

UNITED STATES PATENT AND TRADEMARK OFFICE
CERTIFICATE OF CORRECTION

PATENT NO. :  4,513,062

DATED      :  Apr. 23, 1985

INVENTOR(S) :  Go Suzuki and Kazuo Michishita

It is certified that error appears in the above-identified patent and that said Letters Patent is hereby corrected as shown below:

On the cover page of the patent, left column, insert after the Related U.S. Application Data the following:

-- Foreign Application Priority Data

June 17, 1978 [JP]  Japan  73430/78 --

Signed and Sealed this

Twenty-fifth Day of February 1986

[SEAL]

Attest:

DONALD J. QUIGG

Attesting Officer

Commissioner of Patents and Trademarks